United States Patent Office 2,728,785

Patented Dec. 27, 1955

2,728,785

PROCESS FOR PREPARING LONG-CHAIN 4,5-ETHYLENICALLY UNSATURATED SILANES

Charles J. Albisetti, Jr. and Milton J. Hogsed, Wilmington, Del., assignors to E. I. du Pont de Nemours & Company, Wilmington, Del., a corporation of Delaware No Drawing. Application March 19, 1952, Serial No. 277,541

10 Claims. (Cl. 260—448.2)

This invention relates to the preparation of ethylenically unsaturated silanes and to a new class of such silanes and polymers thereof. More particularly this invention relates to a new method of preparing long-chain, ethylenically unsaturated, negatively substituted silanes and to a new class of long-chain, ethylenically unsaturated, negatively substituted silanes and their polymers.

Relatively short-chain, ethylenically unsaturated silanes are known in the art and have been used in the preparation of addition polymers and copolymers. However, in these short-chain, ethylenically unsaturated silanes, e. g., allyltriethoxysilane, the crotyltrihalosilanes, and the more well-known vinyl and divinyl silicon alkoxides and halides, the ethylenically unsaturated double bond is at most separated from the silicon atom by two carbons and usually by only one carbon. The polymers and copolymers of such compounds have a main polymer chain with the silane residue laterally bonded thereto through at most one carbon and more usually directly bonded to the polymer chain. Heretofore, no method has been available for the preparation of ethylenically unsaturated, negatively substituted silanes wherein the ethylenically unsaturated double bond is separated from the silicon atom by more than a two-carbon chain.

It is an object of this invention to provide a new method of preparing ethylenically unsaturated silanes and a new class of such silanes and polymers thereof. A further object is to provide a new class of relatively long-chain, ethylenically unsaturated, negatively substituted silanes in which the ethylenically unsaturated double bond is separated from the silicon atom by more than a two-carbon chain. A still further object is to provide polymers of these new ethylenically unsaturated silanes in which silicon is joined to the main polymer chain through a lateral side-chain of three carbon atoms. Other objects will be apparent from the description of the invention given hereinafter.

The above objects are accomplished according to the present invention by heating, at elevated temperatures and under superatmospheric pressures in the absence of a polymerization catalyst, a neutral olefinic compound of at least three carbon atoms and a 1-alkenylsilane, such as a vinylsilane, having at least two negative groups directly bonded to the silicon atom, and isolating as the resultant addition product a 4-alkenylsilane.

The invention further comprises, as a new class of ethylenically unsaturated silanes, 4-alkenylsilanes and substituted 4-alkenylsilanes, such as 4-pentenylsilane and substituted 4-pentenylsilanes, which have from one to two 4-alkenyl or substituted 4-alkenyl radicals, such as 4-pentenyl or substituted 4-pentenyl radicals, singly bonded through the 1-carbon thereof to a silicon atom which in turn is bonded respectively to from three to two negative groups, preferably free of reactive, i. e., Zerewitinoff active, hydrogen. Thus, the remaining valences of the silicon atom are satisfied by negative groups, such as alkoxy radicals or halogen. Preferred products of this invention are such 4-alkenylsilanes and 4-substituted 4-alkenylsilanes, such as 4-pentenylsilane and 4-hydrocarbon substituted 4-pentenylsilanes.

More specifically, this new class of ethylenically unsaturated silanes comprises relatively long-chain $\Delta^{4,5}$ silanes containing from five to eighteen carbons in each of the one to two 4-alkenyl radicals directly bonded to the silicon atom of the single silane group with a nonconjugated and preferably the only olefinic carbon-carbon double bond in each such alkene group being in the 4,5 position relative to the silicon atom, said alkene radicals carrying at least one hydrogen on both the one and two carbons relative to the silicon atoms, and as substituents on the main carbon chain only hydrogen and radicals free of reactive, i. e., Zerewitinoff active, hydrogen, and preferably only hydrogen and hydrocarbon radicals free of aliphatic unsaturation, the said $\Delta^{4,5}$ alkenylsilanes carrying from two to three negative groups, preferably likewise free of reactive, i. e., Zerewitinoff active, hydrogen, e. g., halogen or alkoxyl radicals preferably of no more than 4 carbons, each of said negative groups likewise being singly bonded directly to the silicon atom with the total number of said 4-alkenyl radicals and the said negative radicals being four. Thus, this invention includes the 4-alkenylalkoxysilanes and the substituted 4-alkenylalkoxysilanes, such as 4-hydrocarbon substituted 4-alkenylalkoxysilanes, and the 4-alkenylhalosilanes and the substituted 4-alkenylhalosilanes such as the 4-hydrocarbon substituted 4-alkenylhalosilanes. Particularly preferred are the 4-alkenyltrialkoxysilanes, the 4-hydrocarbon substituted 4-alkenyltrialkoxysilanes, the 4-alkenyltrihalosilanes and the 4-hydrocarbon substituted 4-alkenyltrihalosilanes.

The negatively substituted 1-alkenylsilanes used in the condensation reaction of this invention have from one to two olefinically unsaturated hydrocarbon radicals wherein a carbon of the single olefinic carbon-carbon unsaturation of each radical is directly bonded to the silicon atom with at least one hydrogen on the 2-carbon of each such radical and from two to three negative radicals similarly, directly and singly bonded to the silicon atom with the total of said negative radicals and said 1,2-alkene radicals being four. Thus, these 1-alkenylsilanes have from one to two 1-alkenyl radicals, such as the vinyl radical, each bonded through the 1-carbon thereof to the silicon atom with at least one hydrogen on the 2-carbon thereof and the remaining valences of the silicon atom are satisfied by negative groups, such as alkoxy radicals and halogen.

The neutral olefinic compounds used in the condensation reaction have from 3 to 16 carbons, are free of conjugated unsaturation and have an acyclic, olefinic carbon-carbon double bond with at least one of the doubly bonded carbons in said linkage being directly attached to a hydrogen-bearing carbon atom. Thus, included are neutral monoolefinic compounds of at least three carbon atoms having at least one of the doubly-bonded carbons directly attached to a hydrogen-bearing carbon atom.

A convenient method for carrying out the process of this invention consists in heating a mixture of the above-described 1,2-ethylenically unsaturated, negatively substituted silanes and one or more olefinic compounds of the type defined above, e. g., isobutylene, in at least equimolar proportions, and preferably with an excess of the olefinic compound, in a closed reaction vessel capable of withstanding high pressures to a temperature of 200–375° C. under the autogenous pressure developed by the reaction mixture or, if desired, under further externally applied superatmospheric pressure, e. g., 200 to 1,000 atmospheres or higher, of the olefinic compound, or compounds.

It is essential that no polymerization catalyst be present in the reaction mixture. In fact, although not essential to the course of the reaction, a polymerization inhibitor is advantageously included to prevent polymerization of the unsaturated reactants. The resulting addition product of the 1,2-alkene negatively substituted silane with the neutral olefinic compound is isolated from the reaction mixture by conventional methods, e. g., by fractional distillation. The addition product is a member of the new class of 4-pentenyl negatively substituted silanes.

The process of this invention can also be carried out in a continuous manner. In this embodiment, which is very desirable for large-scale operations, the mixture of at least one 1,2-ethylenically unsaturated, negatively substituted silane and at least one monoolefin is passed through a heated reaction zone under superatmospheric pressure, e. g., 200–900 atmospheres, if desired in the presence of an inert diluent, e. g., benzene, at a temperature of 200–375° C. The resultant 4-pentenyl, negatively substituted silane is isolated from the reaction mixture by known methods, most simply by fractional distillation.

It has now been found that this new class of ethylenically unsaturated silanes wherein the unsaturation is in the 4,5 position in a carbon chain joined to the silicon atom can be prepared as described herein. This new class of compounds includes the 4-alkenyl and hydrocarbon substituted 4-alkenyl negatively substituted silanes such as 4-pentenyl and 4-hydrocarbon substituted 4-pentenyl negatively substituted silanes and polymers thereof. The polymers have a main polymer chain and silicon atoms joined thereto through lateral side chains of three carbon atoms.

The following examples in which the parts given are by weight, unless otherwise specified, illustrate specific embodiments of this invention:

EXAMPLE I

*Preparation of 4-methyl-4-pentenetriethoxysilane*

A pressure resistant reaction vessel of internal capacity corresponding to 150 parts of water is charged with 40 parts of vinyltriethoxysilane and 1 part of hydroquinone and the reactor then closed and pressured with 100 atmospheres of isobutylene. The reactor is then heated rapidly until an internal temperature of 240° C. is reached, at which point the initial pressure is 300 atmospheres. The tube is held at this temperature for two hours during which time there is a pressure drop of 210 atmospheres. At the end of the reaction period the reactor is cooled, vented to the atmosphere, opened and the liquid reaction product removed. Fractionation of the product gives 14 parts (35% recovery) of vinyltriethoxysilane, boiling point 80° C., under a pressure corresponding to that of 50 mm. of mercury and 18 parts (about 35% conversion and 53% yield) of 4-methyl-4-pentenetriethoxysilane, boiling point 99° C. under a pressure corresponding to that of 10 mm. of mercury and exhibiting a refractive index, $n_D^{25}=1.4180$.

*Analysis.*—Calculated for $C_{12}H_{26}O_3Si$: C, 58.55%; H, 10.57%. Found: C, 58.61%; H, 10.73%.

Other experiments carried out similarly at 280° C. under 3000 atmospheres' pressure and at 280° C. under 2000 atmospheres' pressure, the latter for only one hour, give conversions of the vinyltriethoxysilane to 4-methyl-4-pentenetriethoxysilane of 46% and 35%, respectively.

A polymerization reactor is charged with 5 parts of the above-described 4-methyl-4-pentenetriethoxysilane, 3 parts of maleic anhydride, 24 parts of C. P. benzene, 0.1 part of alpha,alpha'-azodiisobutyronitrile and the polymerization mixture refluxed under anhydrous conditions for 2½ hours and then allowed to stand at room temperature still under anhydrous conditions for three days. At the end of this time the benzene is removed from the polymerization mixture by vacuum concentration at room temperature. There is thus obtained 6 parts of crude copolymer which is dissolved in benzene and the purified copolymer precipitated therefrom by addition of petroleum ether. There is thus obtained 4 parts of the maleic anhydride/4-methyl-4-pentenetriethoxysilane copolymer as a white powder soluble in benzene.

EXAMPLE II

*Preparation of 4-methyl-4-pentenetrichlorosilane*

In the manner previously described in Example I a pressure resistant reaction vessel is charged with 40 parts of vinyltrichlorosilane and 20 parts of petroleum ether. The reactor is then closed, pressured to 250 atmospheres with isobutylene at room temperature, and then heated rapidly to 240° C., at which point the initial pressure is 1000 atmospheres. The reactor is maintained at this temperature for 3½ hours during which time the pressure drops 300 atmospheres. At the end of this time the reactor is cooled, vented to the atmosphere, opened and the liquid reaction product removed. Fractionation of the crude product gives 15 parts of recovered combined petroleum ether and vinyltrichlorosilane. Most of the unreacted vinyltrichlorosilane and petroleum ether were volatilized by evaporation of the excess isobutylene. Upon further distillation there is finally obtained 39 parts crude (36 parts pure on a calculated basis, corresponding to 68% conversion) of 4-methyl-4-pentenetrichlorosilane as a clear, colorless liquid boiling at 78–80° C. under a pressure corresponding to 20 mm. of mercury. A sample of the 4-methyl-4-pentenetrichlorosilane is further characterized by conversion to the corresponding triethoxy derivative by reaction at 10° C. with ethyl alcohol. The 4-methyl-4-pentenetriethoxysilane thus obtained is a clear, colorless liquid boiling at 100° C. under a pressure corresponding to that of 10 mm. of mercury and exhibiting a refractive index, $n_D^{25}=1.4181$.

*Analysis.*—Calculated for $C_{12}H_{26}O_3Si$: C, 58.55%; H, 10.57%. Found: C, 58.75%; H, 10.74%.

EXAMPLE III

*Preparation of 4-pentenetrichlorosilane*

A pressure resistant reaction vessel of internal capacity corresponding to 150 parts of water is charged with 65 parts of vinyltrichlorosilane and 180 parts of propylene. The reactor is closed and the reaction mixture heated for four hours at 200° C. under autogenous pressure (800 atmospheres). At the end of this time the reactor is cooled to room temperature an opened to the atmosphere and the liquid reaction mixture removed. Fractionation of the crude product yields 38 parts (about 58% recovery) of vinyltrichlorosilane and 14 parts (17% conversion and 41% yield) of 4-pentenetrichlorosilane as a clear, colorless liquid boiling at 162–165° C. under atmospheric pressure.

EXAMPLE IV

*Preparation of 4-octenetrichlorosilane*

A mixture of 150 parts of vinyltrichlorosilane and 150 parts of 1-hexene is heated at 250° C. for four hours in a pressure resistant reaction vessel under autogenous pressure. At the end of this time the reactor is cooled to room temperature, opened to the atmosphere and the liquid reaction product removed. Fractionation of this crude mixture yields 34 parts (23% recovery) of vinyltrichlorosilane and 23 parts (10% conversion and 13% yield) of crude 4-octenetrichlorosilane boiling at 130° C. under a pressure corresponding to 30 mm. of mercury. The 4-octenetrichlorosilane is further characterized by conversion into the corresponding triethoxy derivative by reaction with ethyl alcohol at 10° C. The 4-octenetriethoxysilane thus obtained is a clear, colorless liquid boiling at 135° C. under a pressure corresponding to 10 mm. of mercury.

*Analysis.*—Calculated for $C_{14}H_{30}O_3Si$: C, 61.3%; H, 11.0%. Found: C, 61.7%; H, 11.2%.

EXAMPLE V

*Preparation of 4-phenyl-4-pentenetrichlorosilane*

A mixture of 50 parts of vinyltrichlorosilane and 150 parts of alpha-methylstyrene is heated at 250° C. for four hours in a pressure resistant reaction vessel under autogenous pressure. At the end of this time the reactor is cooled to room temperature, opened to the atmosphere and the liquid reaction mixture removed. Fractionation of this crude mixture yields 22 parts (25% conversion) of crude 4-phenyl-4-pentenetrichlorosilane as a clear, colorless liquid boiling at 130–133° C. under a pressure corresponding to 2 mm. of mercury.

The examples have illustrated preferred embodiments and are not to be construed as limitations of the invention.

This invention is generic to 4-alkenyl and substituted 4-alkenyl, such as 4-pentenyl and hydrocarbon substituted 4-pentenyl, negatively substituted silanes of the following structure:

$$[—C=C—C—CH—CH—]_nSiX_{4-n}$$

wherein the free valences of the carbons indicated are satisfied by hydrogen or hydrocarbon radicals free of reactive hydrogens with the total number of carbons in such hydrocarbon radicals not exceeding 13 carbons, $n$ is the number of 4-alkenyl radicals each attached to silicon and is an interger from 1 to 2, and X is a monovalent negative group. The preferred compounds of this invention possess the same molecular structure with the indicated free valences being satisfied by hydrogen or solely hydrocarbon radicals and X being halogen or alkoxy with no more than four carbons in each alkoxy radical. The most preferred compounds of this invention have this same molecular structure with the various radicals attached to the indicated free valences in each 4-alkenyl radical being hydrogen or solely aliphatically saturated hydrocarbon radicals totaling no more than 13 carbons, i. e., hydrocarbon radicals of up to 13 carbons which are free of aliphatic unsaturation, such as aryl and alkyl radicals particularly in the 4-position of the 4-alkenyl or 4-pentenyl radicals.

In addition to the specific unsaturated negatively substituted silanes used in the preceding examples, other 1-alkenyl negatively substituted silanes can be used. Specific examples of these include the mono-1-alkenyl tri-negatively and di-1-alkenyl di-negatively substituted silanes, e. g., the mono-1-alkenyl trihalogen and di-1-alkenyl di-halogen substituted silanes such as, vinyltrichlorosilane, vinyltrifluorosilane, vinyltribromosilane, vinyltriiodosilane, vinylchlorodifluorosilane, vinylfluorodichlorosilane, divinyldichlorosilane, di-(1-propene)-difluorosilane, and the like; the mono-1-alkenyl trialkoxy and di-1-alkenyl di-alkoxy substituted silanes wherein each alkoxy group contains no more than four carbons, e. g., vinyltri-*n*-butoxysilane, vinyltrimethoxysilane, vinylmethoxydiethoxysilane, divinyldipropoxysilane, and the like; the mono-1-alkenyl tri-negatively and di-1-alkenyl di-negatively substituted silanes wherein the negative substituents are mixed halogen and alkoxy, e. g., vinyldichloroethoxysilane, vinylfluorodibutoxysilane, 1-propenedifluoroethoxysilane, vinylfluorodibutoxysilane, divinylchloropropoxysilane, divinylchloro-*n*-butoxysilane, and the like.

Thus, the mono-1-alkenyl tri-negatively or di-1-alkenyl di-negatively substituted silanes usable in the process of this invention can be conveniently described by the following structural formula:

$$[—CH=C—]_nSiX_{4-n}$$

wherein $n$ is the number of 1-alkenyl radicals attached to silicon and is an interger from 1 to 2, X represents a monovalent negative radical such as halogen or alkoxy of no more than four carbons and the free valences in the 1-alkenyl radicals are filled by hydrogen or hydrocarbon radicals free of reactive, i. e., free of Zerewitinoff active, hydrogen and preferably are solely hydrocarbon free of aliphatic unsaturation, i. e., aliphatically saturated, of no more than 7 carbon atoms apiece and may be alkyl, alkenyl non-conjugated with the 1-alkenyl group, aryl, cycloalkyl, aralkyl, alkaryl in nature.

Thus, the process of this invention is generically applicable to any 1-alkenyl negatively substituted silane, including both the mono-1-alkenyl tri-negatively and di-1-alkenyl di-negatively substituted silanes, wherein the 2 carbon of each 1-alkenyl radical carries at least one hydrogen. Expressed in another way, the process of this invention is generically applicable to those 1-alkenylsilanes which undergo the Diels-Alder reaction with butadiene at room temperature. Because of readier availability, the process of this invention is preferably applicable to those mono-1-alkenyl tri-negatively and di-1-alkenyl di-negatively substituted silanes wherein the negative radicals are free of aliphatic unsaturation and both the 1-alkenyl and negative radicals are free of reactive, i. e., Zerewitinoff active, hydrogen with no more than eight carbons in each said silane and no more than four carbons in each substituent radical of each said silane. Because of greater reactivity in the thermal condensation reaction, it is preferred to use the mono-1-alkenyl tri-negatively substituted silanes. These various 1-alkenyl negatively substituted silanes can be prepared in various ways, for instance according to the processes disclosed in U. S. Patent 2,379,821 and at pp. 37 and 38 of Rochow's "Chemistry of the Silicones," Wiley, 3rd printing, 1947.

The unsaturated reactants which are reacted with the above-described 1-alkenyl negatively substituted silanes in the process of this invention to form the new $\Delta^{4,5}$ alkenyl silanes of this invention are neutral olefinic compounds having at least one open chain olefinic linkage free of conjugated unsaturation, free of reactive hydrogen, i. e., Zerewitinoff active hydrogen, and having joined to one of the doubly bonded carbons a carbon atom containing at least one hydrogen atom attached thereto. The essential portion of these unsaturated reactants, which is necessary for reaction with the 1-alkenylsilanes, is the $$—C=C—CH—$$ structure Specific examples of unsaturated compounds of this type, which are used in the process of this invention to make selected products of this invention, include solely hydrocarbon monoolefins, e. g., 1-propene, 1-butene, 2-butene, triisobutylene, beta-pinene, tetramethylethylene, biallyl, alpha-methylstyrene, 1-pentene, 1-heptene, 1-hexene, 1-octene, 1-decene, 1-hexadecene, allyl benzene; substituted olefins, e. g., unsaturated nitriles such as, allyl cyanide, 5-methyl-5-hexenenitrile, 5-hexenenitrile, unsaturated esters such as, methyl 5-methyl-5-hexenoate, unsaturated ketones such as, methyl heptenone. The preferred type of these neutral unsaturated compounds are the open-chain monoolefinic hydrocarbons of the above-defined structure. Especially preferred are the solely hydrocarbon monoolefins of from 3 to 16, and particularly from 3 to 8, carbon atoms which carry an alkyl group, preferably methyl, as a side chain attached to at least one of the carbon atoms comprising the ethylenic linkage.

The proportions of the two types of reactants can be varied widely in the process of this invention. Equimolar proportions of the 1-alkenylsilanes and the above-defined olefinic compounds can be used to carry out the process of this invention. However, because the products of this invention are thereby prepared in higher yields and because the monoolefinic compounds are, in general, so much cheaper and more readily available than the negatively substituted silanes, it is preferred to use an excess, most preferably a 300 to 400% excess, of the monoolefinic compound.

As pointed out previously in the specification, it is essential that no polymerization initiator be present in the reaction mixture since in the presence of a polymerization initiator the 1-alkenylsilanes readily homopolymerize and also copolymerize with the polymerizable ethylenically unsaturated olefins. It is not necessary for the operability of the process of this invention that a polymerization inhibitor be present, i. e., the reactant compositions are stable polymerization-wise under the conditions of the reaction, as long as no polymerization initiator is present. However, if desired, a polymerization inhibitor can be used. Examples of such materials include the well-known hydroquinones, copper resinates, naphthylamines, beta-naphthol and other antioxidants recognized in the art.

The reaction between the negatively substituted 1-alkenylsilanes and the previously defined olefins takes place under the previously described conditions in the presence or absence of an inert diluent or solvent. For normal batch-wise operations, there is no preference between using a reaction diluent or not. For continuous reactions, due to the greater convenience, it is normally preferred to use a reaction diluent. Any inert organic material, usually liquid, can be used. Examples of these include hydrocarbons such as, benzene, toluene, cyclohexane; ethers such as, dioxane and the like.

The new products obtained by the process of this invention are useful, not only as addition polymerizable monomers as shown in Example I, but also as chemical intermediates; for instance, they are particularly useful as routes to the corresponding silanols which are otherwise difficult to prepare. These products are also effective as insecticides, particularly as miticides and aphicides.

As many apparently widely different embodiments of this invention may be made without departing from the spirit and scope thereof, it is to be understood that this invention is not limited to the specific embodiments thereof except as defined in the appended claims.

We claim:

1. A process for the preparation of ethylenically unsaturated silanes which comprises heating, at an elevated temperature and under superatmospheric pressure in the absence of a polymerization catalyst, a neutral non-conjugated olefinic compound free of Zerewitinoff active hydrogen and of at least three carbon atoms having at least one of the doubly bonded carbons directly attached to a hydrogen-bearing carbon atom and a 1-alkenylsilane having from one to two 1-alkenyl radicals each singly bonded through the 1-carbon thereof to the silicon atom with at least one hydrogen on the 2-carbon thereof, the remaining valences of said silicon atom being satisfied by members selected from the class consisting of halogen and alkoxy groups, and isolating as the resulting product a 4,5-ethylenically unsaturated silane.

2. A process for the preparation of ethylenically unsaturated silanes which comprises heating, at an elevated temperature and under superatmospheric pressure in the absence of a polymerization catalyst, a monoolefinic hydrocarbon of at least three carbon atoms having at least one of the doubly bonded carbons directly attached to a hydrogen-bearing carbon atom and a vinylsilane having from one to two vinyl radicals each singly bonded through the 1-carbon thereof to the silicon atom, the remaining valences of said silicon atom being satisfied by members selected from the class consisting of halogen and alkoxy groups, and isolating as the resulting product a 4,5-ethylenically unsaturated silane.

3. A process for the preparation of ethylenically unsaturated silanes which comprises heating, at an elevated temperature and under superatmospheric pressure in the absence of a polymerization catalyst, a monoolefinic hydrocarbon of at least three carbon atoms having at least one of the doubly bonded carbons directly attached to a hydrogen-bearing carbon atom and a vinylsilane having one vinyl radical singly bonded through the 1-carbon thereof to the silicon atom, the remaining valences of said silicon atom being satisfied by alkoxy radicals, and isolating as the resulting product a 4,5-ethylenically unsaturated silane.

4. A process for the preparation of ethylenically unsaturated silanes which comprises heating, at an elevated temperature and under superatmospheric pressure in the absence of a polymerization catalyst, a monoolefinic hydrocarbon of at least three carbon atoms having at least one of the doubly bonded carbons directly attached to a hydrogen-bearing carbon atom and a vinylsilane having one vinyl radical singly bonded through the 1-carbon thereof to the silicon atom, the remaining valences of said silicon atom being satisfied by halogen and isolating as the resulting product a 4,5-ethylenically unsaturated silane.

5. A process for the preparation of ethylenically unsaturated silanes which comprises heating, at an elevated temperature and under superatmospheric pressure in the absence of a polymerization catalyst, a monoolefinic hydrocarbon of from 3 to 16 carbon atoms having an alkyl group attached to one of the carbon atoms of the olefinic linkage and having at least one of the doubly bonded carbons directly attached to a hydrogen-bearing carbon atom and a vinylsilane having one vinyl radical singly bonded through the 1-carbon thereof to the silicon atom, the remaining valences of said silicon atom being satisfied by alkoxy radicals of 1 to 4 carbon atoms, and isolating as the resulting product a 4,5-ethylenically unsaturated silane.

6. A process for the preparation of ethylenically unsaturated silanes which comprises heating, at an elevated temperature and under superatmospheric pressure in the absence of a polymerization catalyst, a monoolefinic hydrocarbon of from 3 to 16 carbon atoms having a methyl group attached to one of the carbon atoms of the olefinic linkage and a vinylsilane having one vinyl radical singly bonded through the 1-carbon thereof to the silicon atoms, the remaining valences of said silicon atom being satisfied by alkoxy radicals of 1 to 4 carbon atoms, and isolating as the resulting product a 4,5-ethylenically unsaturated silane.

7. A process for the preparation of 4-methyl-4-pentenetriethoxysilane which comprises heating, at an elevated temperature and under superatmospheric pressure in the absence of a polymerization catalyst, isobutylene and vinyltriethoxysilane, and isolating as the resulting product 4-methyl-4-pentenetriethoxysilane.

8. A process for the preparation of ethylenically unsaturated silanes which comprises heating, at an elevated temperature and under superatmospheric pressure in the absence of a polymerization catalyst, a monoolefinic hydrocarbon of from 3 to 16 carbon atoms having an alkyl group attached to one of the carbon atoms of the olefinic linkage and having at least one of the doubly bonded carbons directly attached to a hydrogen-bearing carbon atom and a vinylsilane having one vinyl radical singly bonded through the 1-carbon thereof to the silicon atom, the remaining valences of said silicon atom being satisfied by chlorine and isolating as the resulting product a 4,5-ethylenically unsaturated silane.

9. A process for the preparation of ethylenically unsaturated silanes which comprises heating, at an elevated temperature and under superatmospheric pressure in the absence of a polymerization catalyst, a monoolefinic hydrocarbon of from 3 to 16 carbon atoms having a methyl group attached to one of the carbon atoms of the olefinic linkage and a vinylsilane having one vinyl radical singly bonded through the 1-carbon thereof to the silicon atom, the remaining valences of said silicon atom being satisfied by chlorine, and isolating as the resulting product a 4,5-ethlyenically unsaturated silane.

10. A process for the preparation of 4-methyl-4-pentenetrichlorosilane which comprises heating, at an elevated temperature and under superatmospheric pressure in the absence of a polymerization catalyst, isobutylene and vinyltrichlorosilane, and isolating as the resulting product 4-methyl-4-pentenetrichlorosilane.

References Cited in the file of this patent

UNITED STATES PATENTS 2,407,181 Scott ------------------ Sept. 3, 1946

OTHER REFERENCES

Barry et al.: "Jour. Am. Chem. Soc.," vol. 69 (1947), page 2916.